US008117576B2

(12) United States Patent
Mossawir et al.

(10) Patent No.: US 8,117,576 B2
(45) Date of Patent: Feb. 14, 2012

(54) METHOD FOR USING AN EQUIVALENCE CHECKER TO REDUCE VERIFICATION EFFORT IN A SYSTEM HAVING ANALOG BLOCKS

(75) Inventors: Kathryn M. Mossawir, Mountain View, CA (US); Kevin D. Jones, Hayward, CA (US)

(73) Assignee: Rambus Inc., Sunnyvale, CA (US)

( * ) Notice: Subject to any disclaimer, the term of this patent is extended or adjusted under 35 U.S.C. 154(b) by 423 days.

(21) Appl. No.: 12/397,298

(22) Filed: Mar. 3, 2009

(65) Prior Publication Data
US 2009/0228849 A1 Sep. 10, 2009

Related U.S. Application Data

(60) Provisional application No. 61/034,124, filed on Mar. 5, 2008.

(51) Int. Cl.
*G06F 17/50* (2006.01)
(52) U.S. Cl. ........ 716/107; 716/101; 716/104; 716/105; 716/106
(58) Field of Classification Search .......... 716/101, 716/104–107
See application file for complete search history.

(56) References Cited

U.S. PATENT DOCUMENTS

| 5,297,066 | A | * | 3/1994 | Mayes | 703/14 |
|---|---|---|---|---|---|
| 5,404,319 | A | | 4/1995 | Smith et al. | 364/578 |
| 5,481,486 | A | * | 1/1996 | Cliff et al. | 708/235 |
| 5,822,567 | A | * | 10/1998 | Takeuchi | 703/14 |
| 6,086,626 | A | * | 7/2000 | Jain et al. | 716/103 |
| 6,230,294 | B1 | * | 5/2001 | Saito | 714/740 |
| 6,470,482 | B1 | | 10/2002 | Rostoker et al. | 716/6 |
| 6,629,294 | B2 | * | 9/2003 | Van Stralen | 716/102 |
| 6,813,597 | B1 | | 11/2004 | Demler | 703/14 |
| 6,820,243 | B1 | * | 11/2004 | Shey et al. | 716/106 |
| 6,898,767 | B2 | * | 5/2005 | Halstead | 716/103 |
| 7,047,173 | B1 | * | 5/2006 | Larky et al. | 703/14 |
| 7,076,415 | B1 | | 7/2006 | Demler et al. | 703/14 |
| 7,260,792 | B2 | | 8/2007 | Chetput et al. | 716/2 |
| 7,360,187 | B2 | * | 4/2008 | Jones et al. | 716/106 |
| 7,643,979 | B2 | * | 1/2010 | Hong et al. | 703/14 |
| 7,865,348 | B1 | * | 1/2011 | Au et al. | 703/15 |
| 2003/0212969 | A1 | * | 11/2003 | Korzyniowski et al. | 716/5 |
| 2005/0216874 | A1 | | 9/2005 | Denk et al. | 716/5 |
| 2005/0289490 | A1 | * | 12/2005 | Shastri et al. | 716/4 |
| 2007/0079268 | A1 | * | 4/2007 | Jones et al. | 716/5 |
| 2007/0106963 | A1 | * | 5/2007 | Baumgartner et al. | 716/2 |

OTHER PUBLICATIONS

"Prover eCheck 4.3 Reference and User Guide," Prover Technology AB, 2005, 111 pages.
"Encounter® Conformal® Equivalence Checking User Guide, Conformal ASCI, Conformal Ultra, and Conformal Custom," Cadence Design Systems, Inc., Feb. 2007, 403 pages.

* cited by examiner

*Primary Examiner* — Stacy Whitmore
(74) *Attorney, Agent, or Firm* — Morgan, Lewis & Bockius LLP

(57) ABSTRACT

A computer-implemented method of performing an equivalence check on a mixed-signal circuit is performed on a server system, and includes responding to a verification request. In the method, the following operations are performed. A static analysis is performed on a first netlist, and a synthesizable section and non-synthesizable section of the first netlist are identified. A functional equivalence is determined between the non-synthesizable section of the first netlist and a corresponding non-synthesizable section of a second netlist, and a logical equivalence is determined between the synthesizable section of the first netlist and a corresponding synthesizable section of a second netlist. An equivalence result is provided based on the determined functional equivalence and the determined logical equivalence.

36 Claims, 5 Drawing Sheets

400

Performing a static analysis on a first netlist and identifying a synthesizable section and non-synthesizable section of the first netlist.
410

Determining functional equivalence between the non-synthesizable section of the first netlist and a corresponding non-synthesizable section of a second netlist.
420

Checking if the non-synthesizable portion of the first netlist has a different characteristic than the corresponding non-synthesizable portion of the second netlist
422

The characteristic is selected from a time stamp, version control number, checksum, file name, operator identifier, permission level, location, or information in the netlist.
424

Performing a text difference detecting operation between the first netlist and second netlist.
426

Performing a simulation on the non-synthesizable section of the first netlist and the second netlist and comparing the results.
428

Determining logical equivalence between the synthesizable section of the first netlist and a corresponding synthesizable section of a second netlist.
430

Providing an equivalence result based on the determined functional equivalence and the determined logical equivalence.
440

FIG. 4

METHOD FOR USING AN EQUIVALENCE CHECKER TO REDUCE VERIFICATION EFFORT IN A SYSTEM HAVING ANALOG BLOCKS

RELATED APPLICATION

This application claims priority to U.S. Provisional Application No. 61/034,124, filed Mar. 5, 2008, entitled "Method for Using an Equivalence Checker to Reduce Verification Effort in a System Having Analog Blocks," which is incorporated herein by reference in its entirety.

TECHNICAL FIELD

The disclosed embodiments relate generally to electronic design automation (EDA) verification tools. More particularly, the disclosed embodiments relate to methods, systems, and user interfaces for using an equivalence checker to reduce the verification effort required in a system having analog blocks.

BACKGROUND

FIG. 1 shows a simplified representation of a design flow 100 for the design, verification and manufacture of integrated circuits (chips). Many of the operations in the design flow 100 are performed using computer-implemented tools, including computer-aided design (CAD) tools. Many of the operations are implemented in software, the software running on hardware servers and workstations.

In a design specification document 110, parameters for a chip design or semiconductor product are listed, and characteristics such as function, speed, power consumption, noise levels, signal quality, cost, etc. are described.

In a circuit implementation operation 120 a semiconductor circuit is generated (i.e., one or more circuit designs for the circuit are generated) based on the information in specification document 110. For ease of explanation and discussion, in the following discussion the terms "circuit" and "semiconductor circuit" shall be understood to mean the design (e.g., netlist and/or physical layout) of the circuit, as opposed to a physical circuit that physically conducts currents and signals. EDA tools are commonly used to generate the detailed design of a semiconductor circuit. In a system specification operation 122, the design parameters 110 for the semiconductor circuit, including an interface to a system, are provided to one or more EDA tools. The design parameters are later checked against a completed semiconductor circuit. In a circuit design and test operation 124, a circuit implementing the system specification 122 is generated manually (known as a "custom" or "full custom" design), or automatically by a compiler tool, using ready-made IP functions, etc., or by using a combination of these operations. In a custom design, the circuit is entered by schematic capture, by a hardware description language (such as Verilog, VHDL, or any other hardware description language (HDL)), by graphic entry, or by other means. In a circuit synthesis operation 126, a netlist of the circuit is generated by synthesizing the circuit design 124 into a gate-level representation of the circuit design. Synthesis is generally performed only on synthesizable logic sections of the circuit 124, in a logic synthesis operation. If the circuit 124 includes a section that cannot be synthesized (e.g., an analog block), that section of the circuit may be called a non-synthesizable section. In logic synthesis an abstract form of desired circuit behavior (typically a register transfer level (RTL) description or behavioral description) is turned into a design implementation in terms of logic gates. In a verification operation 128, the netlist output by the circuit synthesis operation 126 is verified for functionality against the circuit design 124, and optionally against the desired system specification 122, using a test-bench program or test vectors. The operations 124, 126, and 128 are repeated until the netlist meets the desired parameters.

In a floorplanning and layout operation 130, a physical implementation of the netlist on a physical medium, such as a die on a semiconductor wafer, is specified. In an analysis operation 132, a transistor-level simulation of the netlist 126 is performed to verify functionality, timing, and performance across predefined or user-specified ranges of process, voltage, and temperature parameters. In a physical verification operation 134, the physical implementation 130 is analyzed for parasitic effects such as parasitic capacitance, inductance, resistance, and other effects. The physical implementation is verified to make sure it does not violate design rules for the semiconductor process on which the integrated circuit will be manufactured. Operations 130, 132, and 134 are repeated until the physical implementation (i.e., a specification of the physical implementation) meets desired parameters. In a mask preparation operation 136, optical pattern data (commonly called "mask data") is generated from the physical implementation for use on a photolithographic mask.

In a tape-out operation 140, the optical pattern data 136 is written to a magnetic tape (this process is called "tape out") and/or sent to a semiconductor wafer manufacturer by physical or electronic means. In an operation 150, the semiconductor wafer manufacturer uses the optical pattern data 136 to generate photolithographic masks. These photolithographic masks are then used by a wafer fabricator to manufacture semiconductor wafers. In saw operation 160, the manufactured semiconductors wafers are sawn into individual dice, in a die separation process. The individual dice are then assembled into individual packages and tested. Optionally, preliminary testing of the individual die may be performed before the wafers are sawn into individual dice, thereby identifying die which may be discarded prior to additional investment of testing and assembly resources. In operation 170, the packaged integrated circuits are prepared for sale.

SUMMARY OF DISCLOSED EMBODIMENTS

In one embodiment, a computer-implemented method of performing an equivalence check on a mixed-signal circuit is performed on a server system, and includes responding to a verification request. In the method, the following operations are performed. A static analysis is performed on a first netlist and a synthesizable section and non-synthesizable section of the first netlist are identified. A functional equivalence is determined between the non-synthesizable section of the first netlist and a corresponding non-synthesizable section of a second netlist, and a logical equivalence is determined between the synthesizable section of the first netlist and a corresponding synthesizable section of a second netlist. An equivalence result is provided based on the determined functional equivalence and the determined logical equivalence.

In another embodiment, a computer-implemented system for performing an equivalence check on a mixed-signal circuit includes one or more processors and memory storing one or more program modules or program instructions to be executed by the one or more processors. The modules or program instructions include data-retrieval instructions for retrieving a first netlist and a second netlist, and static analysis instructions for receiving the first netlist and identifying a synthesizable section and non-synthesizable section of the first netlist. Functional equivalence instructions receive at least a portion of the first netlist and at least a portion of the second netlist and determine functional equivalence between the non-synthesizable section of the first netlist and a corresponding non-synthesizable section of a second netlist. Logical equivalence instructions receive at least a portion of the first netlist and at least a portion of the second netlist and determine logical equivalence between the synthesizable section of the first netlist and a corresponding synthesizable section of a second netlist. The system includes output instructions for providing an equivalence result, based on the determined functional equivalence and the determined logical equivalence, to determine if the first netlist is a trusted netlist.

In another embodiment, a computer-readable storage medium stores instructions that when executed by one or more processors of a server will cause the server to perform a verification operation in response to a command from a client. Execution of the instructions causes the following operations to be performed. A static analysis is performed on a first netlist to identify a synthesizable section and non-synthesizable section of the first netlist. A functional equivalence is determined between the non-synthesizable section of the first netlist and a corresponding non-synthesizable section of a second netlist, and a logical equivalence is determined between the synthesizable section of the first netlist and a corresponding synthesizable section of a second netlist. An equivalence result is provided to the client based on the determined functional equivalence and the determined logical equivalence.

In another embodiment, a computer system includes a display, one or more processors, and memory storing one or more program modules or program instructions for execution by the one or more processors. The program modules or program instructions include verification instructions for rendering on the display a portion of a verification operation. In the verification operation, certain operations are performed. A first netlist and a second netlist are accessed. A static analysis is performed on the first netlist and a synthesizable section and non-synthesizable section of the first netlist are identified. A functional equivalence is determined between the non-synthesizable section of the first netlist and a corresponding non-synthesizable section of the second netlist, and a logical equivalence is determined between the synthesizable section of the first netlist and a corresponding synthesizable section of the second netlist. An equivalence result is provided, based on the determined functional equivalence and the determined logical equivalence, for rendering on the display.

In another embodiment, a computer-readable storage medium stores instructions which when executed by one or more processors will cause the one or more processors to perform operations, including the following. A static analysis is performed on a first netlist and a synthesizable section and non-synthesizable section of the first netlist are identified. A functional equivalence is determined between the non-synthesizable section of the first netlist and a corresponding non-synthesizable section of a second netlist, and a logical equivalence is determined between the synthesizable section of the first netlist and a corresponding synthesizable section of a second netlist. An equivalence result is provided, based on the determined functional equivalence and the determined logical equivalence, for rendering on a display of a computer system.

BRIEF DESCRIPTION OF THE DRAWINGS

Various embodiments are disclosed in the following Description of Embodiments herein, in conjunction with the following drawings in which like reference numerals refer to corresponding parts throughout the figures.

FIG. 4 is a flowchart of a method of performing at a server an equivalence check on a mixed-signal circuit in accordance with some embodiments.

DESCRIPTION OF EMBODIMENTS

Methods, systems, user interfaces, and other aspects of the invention are described. Reference will be made to certain embodiments, examples of which are illustrated in the accompanying drawings. While the invention will be described in conjunction with the embodiments, it will be understood that it is not intended to limit the invention to these particular embodiments. On the contrary, the invention is intended to cover alternatives, modifications, and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention can be practiced without these particular details. In other instances, methods, procedures, components, and networks that are well known to those of ordinary skill in the art are not described in detail to avoid obscuring aspects of the present invention.

Figure 1:
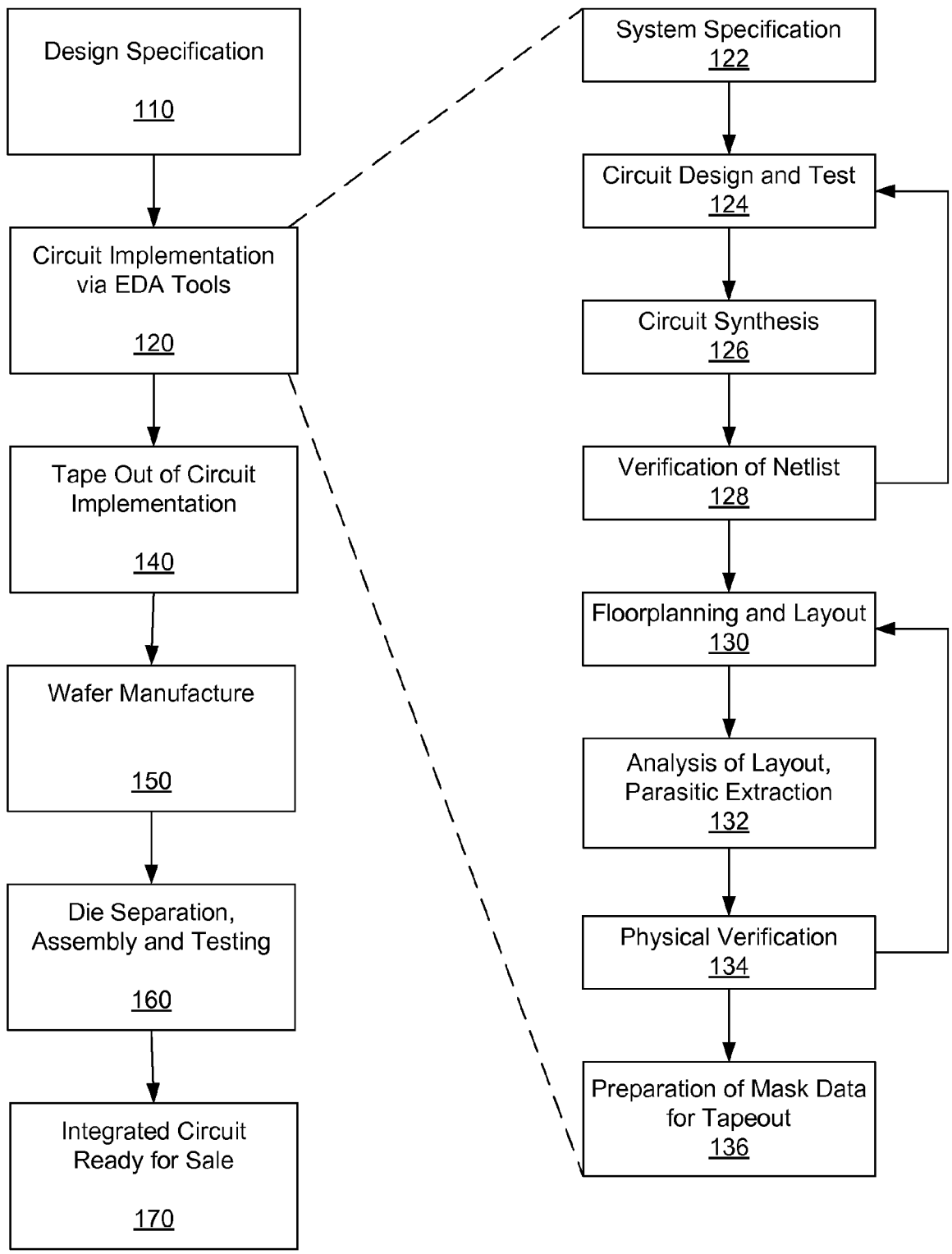
FIG. 1 is a block diagram illustrating an exemplary design flow for the design, verification and manufacture of integrated circuits.
Figure 2:
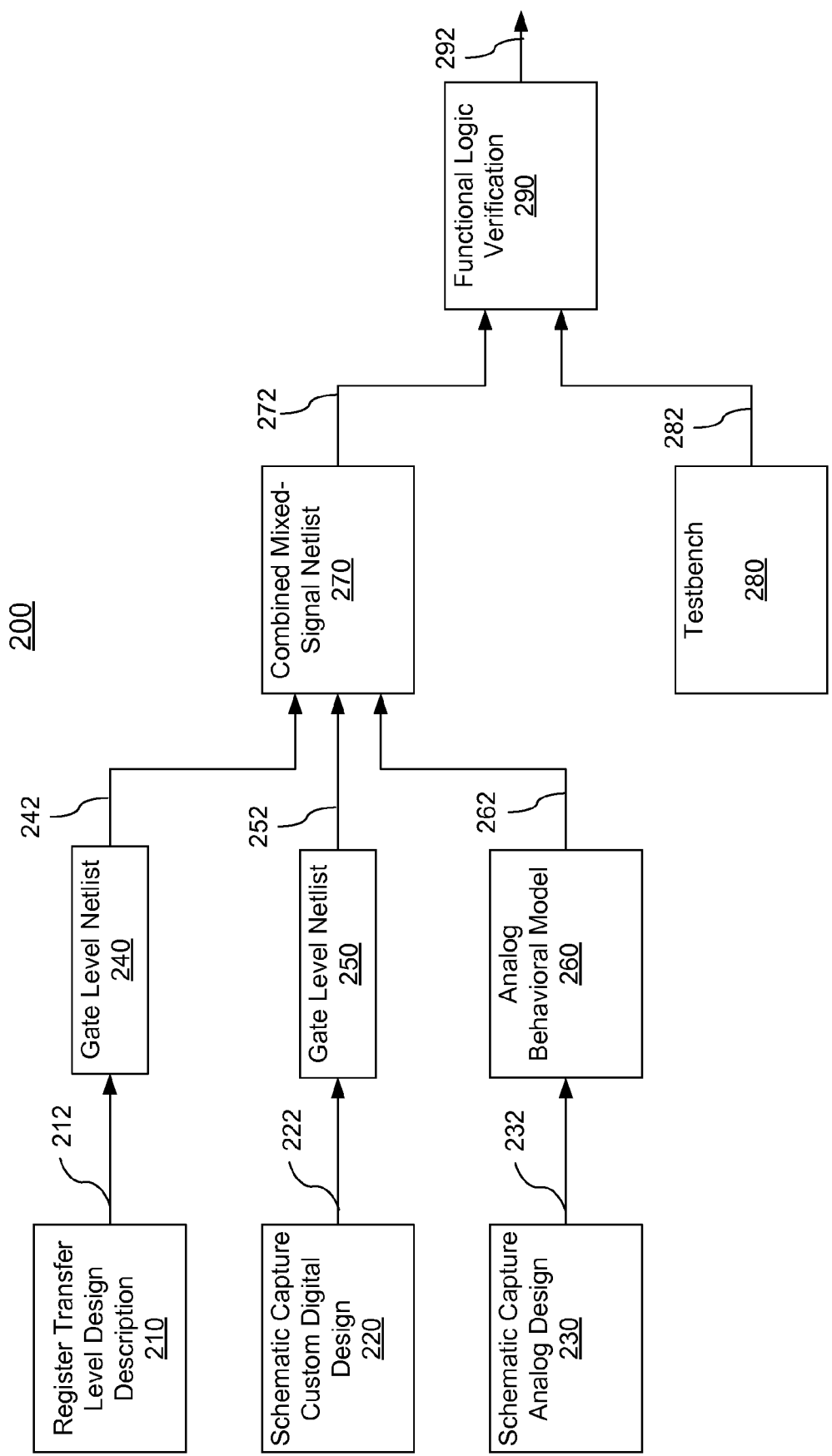
FIG. 2 is a block diagram illustrating a mixed-signal design verification process in which analog blocks are modeled as black-boxes in accordance with some embodiments.

FIG. 2 is a block diagram illustrating a mixed-signal design verification process 200. The inputs to the design verification process include at least one digital circuit description 210 (e.g., an RTL design description) and/or 220 (e.g., a schematic capture or other custom digital design), and at least one analog circuit description 230. The digital circuit description 210, if any, undergoes a synthesis operation 212 producing a gate-level netlist 240. The netlist 240 is integrated 242 into a combined mixed-signal netlist 270. In an embodiment, the digital circuit description and the gate-level netlist are specified in Verilog, VHDL, or any other hardware description language, or a combination of languages and formats. The schematic capture custom digital design 220, if any, undergoes a synthesis operation 222 producing a gate-level netlist 250. The netlist 250 is integrated 252 into the combined mixed-signal netlist 270. An analog design 230 (e.g., a schematic capture analog design or a transistor-level netlist) undergoes a conversion or modeling operation 232 producing an analog behavioral model 260. The behavioral model 260 is integrated 262 into the combined mixed-signal netlist 270. The behavioral model 260 of the analog design 230 is provided in a format that can be utilized by the functional logic verification 290. For example, in one embodiment the analog circuits in analog design 230 are converted to non-synthesizable Verilog code that can be used by a Verilog simulator for simulating circuit behavior, but which is not suitable for use in a digital logic equivalence check 330. In this example, the non-synthesizable Verilog code is an example of a behavioral model 260 and the Verilog simulator is an example of a functional logic verification tool. The combined mixed-signal netlist 270 is formed from gate-level netlist 240, gate-level netlist 250 and the behavioral model 260. Combined netlist 270 models the functional behavior of the combined circuit, including both the digital and the analog portions of the combined circuit. The combined netlist 270 is provided 272 to functional logic verification 290.

A test-bench 280 is also provided 282 to functional logic verification 290. The test-bench 280 includes test procedures, vectors (e.g., input stimulus vectors), patterns and other means of testing the functionality of the combined mixed-signal netlist 270. The functional logic verification 290 executes the test-bench 280 against the netlist 270, and provides a result 292. In an embodiment, the result 292 gives a pass/fail indication describing whether the combined mixed-signal netlist 270 passes functional testing or not. In some embodiments, the result 292 gives detailed information as to the tests performed, results, points of failure, etc.

In an embodiment, the functional logic verification 290 performs simulation on the gate-level netlists 240 and 250 and the analog behavioral model 260 in the combined netlist 270. The analog behavioral model 260 can be simulated using a tool such as a Verilog simulator, which may also be used to simulate operation of the netlists 240 and 250. Alternately, in some embodiments, the analog design 230 is simulated separately using a transistor-level simulation (e.g., by using a Spice or Verilog AMS transistor-level simulator) to test the functionality of the analog circuit (analog design 230), in which case the analog behavioral model 260 may not be needed. However, since running transistor-level simulations generally requires considerable server time, and as a result is both slow and computationally expensive, behavioral simulation using a behavioral model 260 of the analog circuit design 230 may be preferred over transistor-level simulations for the purpose of functional logic verification.

Figure 3:
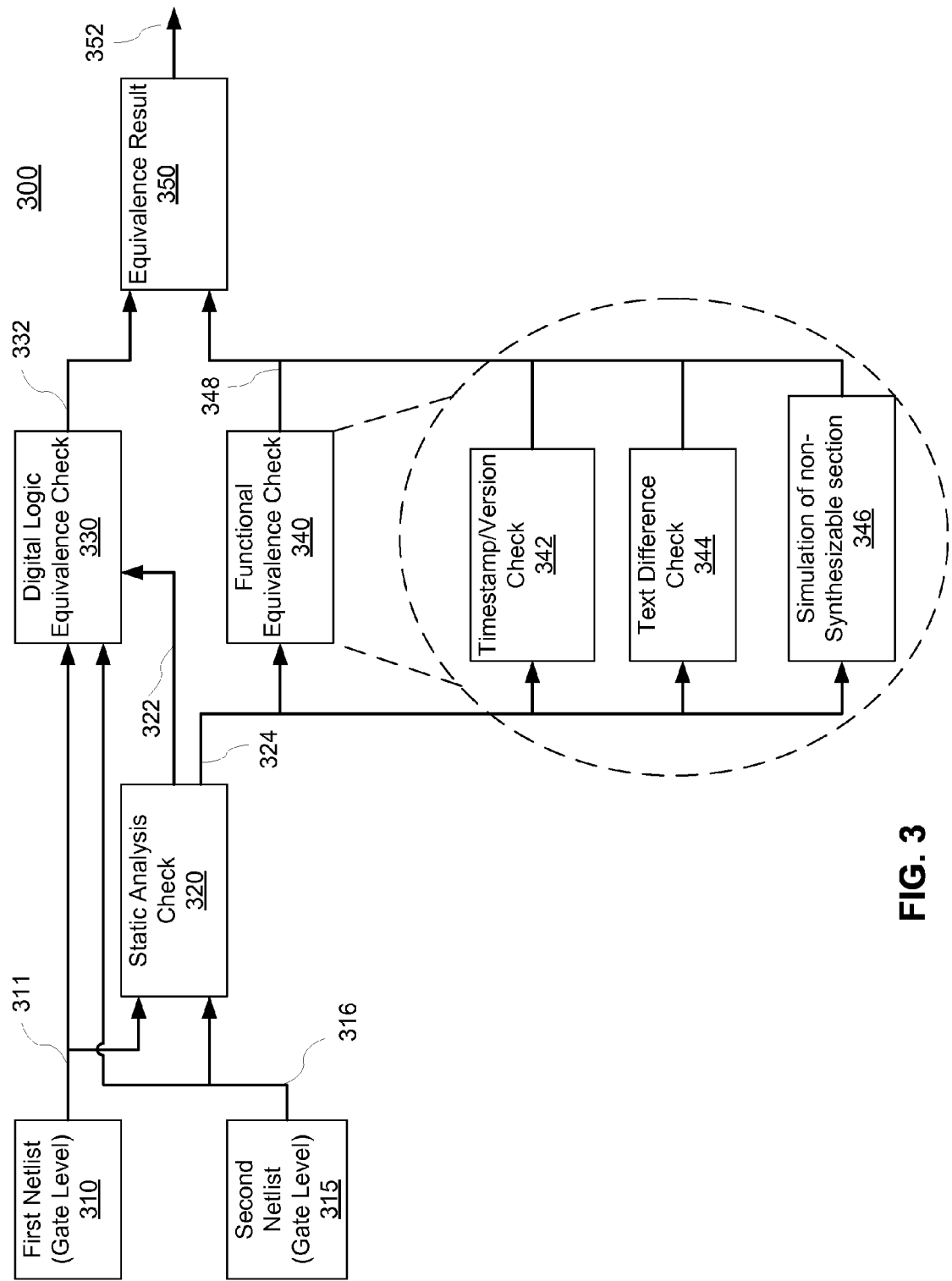
FIG. 3 is a block diagram illustrating a mixed-signal design verification process with efficient equivalence checking of analog blocks in accordance with some embodiments.

FIG. 3 is a block diagram illustrating a mixed-signal design verification process 300 with efficient equivalence checking of analog blocks. Equivalence checking is a process to formally prove that two representations of a circuit exhibit exactly the same behavior. The goal of equivalence checking between two netlists is to verify that the functionality of the netlists is identical. Generally, equivalence checking is performed on two versions of the same netlist, one version (the "new" netlist, herein also called the first netlist) more recent than the other (the "trusted" netlist, herein also called the second netlist). If the functionality of the new netlist and trusted netlist can be proven to be identical, this avoids the need for doing an expensive simulation of the new netlist.

In the verification process 300, a first (new) netlist 310 and a second (trusted) netlist 315 are compared. In an embodiment, both the new netlist 310 and trusted netlist 315 are gate-level netlists which contain digital and analog sections. The new netlist 310 is provided 311 to a digital logic equivalence check 330 and to a static analysis check 320. The trusted netlist 315 is also provided to the digital logic equivalence check 330 and optionally to the static analysis check 320.

Alternately, the new circuit design received by the static analysis check 320 may include an RTL description for some or all of the synthesizable portions of the new circuit design, in which case the static analysis check 320 includes synthesis of the gate level netlist for that portion of the new circuit design.

The static analysis check 320 analyzes the new netlist 310 to determine a synthesizable section and a non-synthesizable section of the new netlist. Static analysis checking is the analysis of a hardware or software design that is performed without actually implementing the design or executing programs built from the software. For hardware designs, static analysis is generally performed on an HDL description of the design or a netlist representation of the design. Static analysis is performed by an automated tool, an example of which is the "Lint" program. In an embodiment, the static analysis check 320 optionally analyzes the trusted netlist 315 to determine a synthesizable (digital) section and a non-synthesizable (analog) section of the trusted netlist. However, in embodiments in which results of a prior static analysis operation on the trusted netlist are available (e.g., stored locally, remotely or on a storage medium), the static analysis check 320 accesses those results instead of re-running a static analysis on the trusted netlist 315. This saves processor cycles and computing resources.

Information regarding the synthesizable portions of the new netlist 310, and optionally of the trusted netlist 315, is provided 322 to the digital logic equivalence check 330. The digital logic equivalence check 330 uses the information from the static analysis check 320, the new netlist 310 and trusted netlist 315 to check for equivalence between the digital logic sections of the new netlist 310 and trusted netlist 315. In an embodiment, the result of digital logic equivalence check 330 is provided to equivalence result function 350.

In another embodiment, the static analysis check 320 provides the synthesizable portions of the new and trusted netlist to the digital logic equivalence check 330. In this embodiment, the digital logic equivalence check 330 would not need to receive the entire new netlist 310 and trusted netlist 315 from providing operations 311 and 316, respectively.

The static analysis check 320 provides an output 324 indicating the non-synthesizable (analog) sections of the new netlist 310 and trusted netlist 315 to a functional equivalence check 340. In an embodiment, outputs 322 and 324 are combined (e.g., in a single set of information, or in a single signal). Functional equivalence check 340 analyzes the output 324 (the non-synthesizable or analog sections of the new netlist 310 and trusted netlist 315) from the static analysis check 320 and runs testing procedures on the new and trusted netlist to determine functional equivalence. Two designs are functionally equivalent if they produce exactly the same sequence of output signals for any valid sequence of input signals. In an embodiment, functional equivalence check 340 includes testing procedures 342, 344, and 346, described below. A result 348 of functional equivalence check 340 is provided to equivalence result function 350.

A first testing procedure 342 compares identifying information of the new and trusted netlists. In an embodiment, the identifying information includes one or more of the following information items: a last time modified (e.g., a time stamp, which can include a date, or a date stamp representing a last time that the netlist was modified), a version control number, an operator identifier (e.g., an identifier of the last operator to access the file), a checksum, a file name (which can include a file path), a permission level, and a location (e.g., a physical location, a network location, or an Internet location). In an embodiment, the identifying information includes information in the netlists such as a header, footer, tag or checksum such as a cyclic redundancy check (CRC). An advantage of testing procedure 342 is that if the new netlist and trusted netlist can be shown to have identical identifying information (e.g., the same last time modified and/or checksum), then no changes have occurred, and thus they are equivalent. This avoids the need to run an expensive (in terms of processor time/cycles) simulation of the non-synthesizable section. Thus, if the first testing procedure 342 is successful at determining functional equivalence of the new and trusted netlists, other testing procedures (e.g., procedures 344 and 346) for determining functional equivalence need not be executed. The result of testing procedure 342 is provided to functional equivalence check 340. In an embodiment, functional equivalence check 340 and equivalence result function 350 are combined.

A second testing procedure 344 includes a difference check between the new and trusted netlists. A text-comparison utility is used to perform the testing procedure 344. An example of a commonly used text-comparison utility is the "diff" program, which is a file-comparison utility that outputs the differences between two files. The "diff" program displays the changes made per line for text files. In an embodiment, the testing procedure 344 supports both text files and binary files. In an embodiment, the testing procedure 344 compares non-synthesizable portions of the new netlist 310 and the trusted netlist 315 to determine if any changes have been made to their respective contents. The files corresponding to the new netlist 310 and trusted netlist 315 are in text format or binary format. If a difference is found between the respective contents of the non-synthesizable portion of new netlist 310 and trusted netlist 315, the difference is reported to functional equivalence check 340. In an embodiment, the difference is analyzed to determine if it is meaningful or inconsequential. Stated in another way, if the difference does not correspond to a functional difference between the non-synthesizable portions of the new and trusted netlists, then the result second testing procedure 344 is a determination that the non-synthesizable portion of the first and second netlists are functionally equivalent. In that case, other testing procedures (e.g., procedure 346) for determining functional equivalence need not be executed.

For example, in a netlist text file in the Verilog language, the addition of an extra space character might not change the function of the netlist, in which case it would be an inconsequential difference and the result of the second testing procedure 344 is a determination that the non-synthesizable portions of the first and second netlists are functionally equivalent. On the other hand, if the difference is consequential (e.g., a section of code in the non-synthesizable portion of the netlist has been modified, which may result in a change in function), then the result of the second testing procedure 344 is negative. In this case, additional testing (e.g., by executing an additional testing procedure 346) is needed to determine whether the non-synthesizable portions of the new and trusted netlists are functionally equivalent. The result of the second testing procedure 344 is provided to functional equivalence check 340.

The third testing procedure 346 includes a transistor-level simulation or behavioral simulation of the non-synthesizable portion of the new netlist. As noted above, in some embodiments the third testing procedure 346 is performed only if the first and/or second testing procedures 342, 344 have been unable to determine that the non-synthesizable portions of the first and second netlists are functionally equivalent. The transistor-level simulation may be implemented as a Spice simulation, a Verilog-AMS simulation, or another form of analog simulation. Alternately, a behavioral simulation may be implemented using non-synthesizable Verilog code to represent the non-synthesizable portions of the new netlist, and a Verilog simulator to generate a representation of the behavior of the non-synthesizable portion of the new netlist. In both cases, a test-bench appropriate for both the non-synthesizable portion of the netlist and the type of simulation being performed is used to generate input stimulus for the simulation of the non-synthesizable portion of the new netlist. The test-bench used for simulation of the non-synthesizable portion of the netlist by the third testing procedure 346 is typically distinct from the test-bench 280 (FIG. 2) used for full system simulation by functional logic verification 290 (FIG. 2). More generally, the third testing procedure 346 is selected so as to produce an output that represents the behavior of the non-synthesizable portion of the new netlist and that can be directly compared to a representation of the behavior of the non-synthesizable portion of the second (e.g., trusted) netlist. Thus, the testing procedure 346 models the behavior of the non-synthesizable portion of the new netlist and compares it to the behavior of the non-synthesizable portion of the trusted netlist. In an embodiment, the results of this comparison are provided to the functional equivalence check 340. In an embodiment, the simulation outputs for the new and trusted netlists are provided to the functional equivalence check 340 which performs a comparison of the results.

Equivalence result function 350 receives a result 332 produced by the digital logic equivalence check 330 and a result 348 produced by the functional equivalence check 340. Using the received results 332 and 348, equivalence result function 350 makes a determination as to whether the new netlist 310 and trusted netlist 315 are equivalent, and provides an output 352. This output 352 is provided to a user, or to another program or system.

FIG. 4 is a flowchart of a method 400 of performing an equivalence check on a mixed-signal circuit. The method 400 may be performed at a server, or at a workstation or other computer system. The method 400 begins when a request for verification of a new netlist is received. If the method is performed at a server, the verification request may be received from a client (e.g., a workstation or other computer system) that is remotely located from the server. If the method is performed at a workstation or the like, the verification request may be received from another application or by a locally executed user-initiated command.

The method 400 includes performing a static analysis on a first (new) netlist and identifying a synthesizable section and non-synthesizable section of the new netlist (410). The method also includes determining functional equivalence between the non-synthesizable section of the new netlist and a corresponding non-synthesizable section of a trusted netlist (420), and determining logical equivalence between the synthesizable section of the new netlist and a corresponding synthesizable section of a trusted netlist (430). The method further includes providing an equivalence result based on the determined functional equivalence and the determined logical equivalence (440). Providing an equivalence result 440 may include displaying a result of the determination on a display of either the computer system that performs the method or a remotely located computer system. Alternately, operation 440 may include sending information about the result to a workstation or other computer. For example, when the process 400 is performed in response to a command or request received from a client (e.g., a workstation or other computer system), the result of the process is returned to the requesting client.

In some embodiments, the functional equivalence checking operation 420 includes checking (422) if the non-synthesizable portion of the first (new) netlist has a different characteristic than the corresponding non-synthesizable portion of the second (trusted) netlist. The characteristic checked in operation 422 includes one or more of a time stamp, version control number, checksum, file name, operator identifier, permission level, location, or information in the netlist (424). In an embodiment, the file name can include a file path for a local drive, a server, or a network or Internet location. In an embodiment, the version control number can include a file owner, a last operator, a revision number, or other information identifying the history of the file that contains the first netlist or the non-synthesizable portion of the first netlist. In one embodiment, checking operation 420 compares the file names and file paths of the first (new) and second (trusted) netlists and the file version numbers of the first and second netlists.

In some embodiments, if operation 422 is unable to determine that the non-synthesizable portion of the first and second netlists are functionally equivalent, operation 420 further includes performing a difference operation 426 between the new netlist and the trusted netlist to determine a difference, if any, between the non-synthesizable portions of the first and second netlists. In an embodiment, the difference is a text difference or a binary difference. As described above, if the difference is non-existent, or if the difference does not correspond to a functional difference between the non-synthesizable portions of the first and second netlists, then the result of operation 426 is a determination that the non-synthesizable portion of the first and second netlists are functionally equivalent.

In some embodiment, if operation 422 and/or operation 426 is unable to determine that the non-synthesizable portion of the first and second netlists are functionally equivalent, operation 420 also includes performing 428 a transistor-level simulation or a behavioral simulation on the non-synthesizable section of the new netlist and the trusted netlist and comparing the results to determine if the first and second netlists are functionally equivalent.

Figure 5:
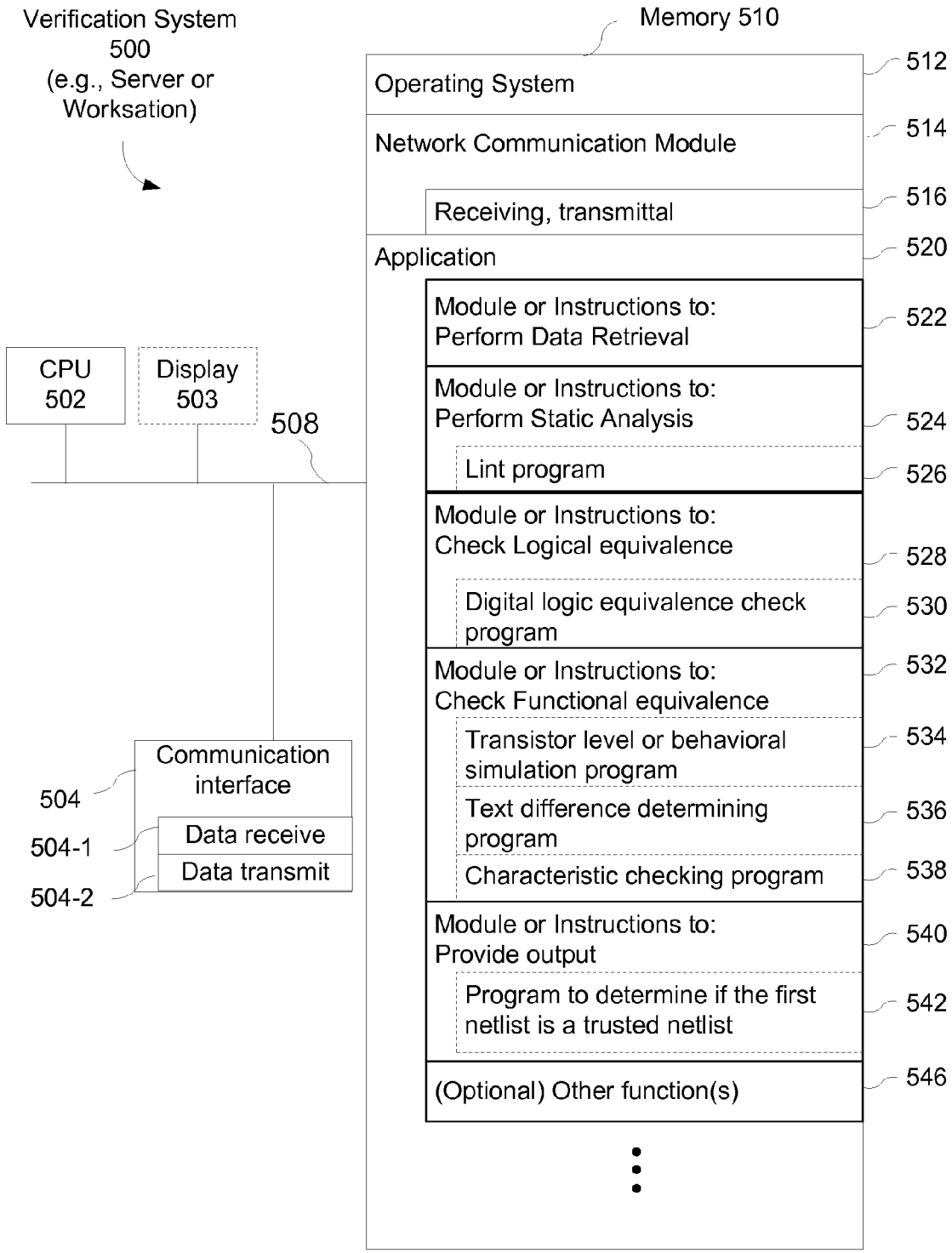
FIG. 5 is a block diagram of a verification system, server or workstation for performing an equivalence check on a mixed-signal circuit in accordance with some embodiments.

FIG. 5 is a verification system 500 (e.g., a server, a workstation, or other computer system) for performing an equivalence check on a mixed-signal circuit. The verification system 500 includes one or more processors (CPUs) 502 for executing modules, programs and/or instructions stored in memory 510 and thereby performing processing operations; one or more network or other communication interfaces 504; and one or more communication busses 508 for interconnecting these components of the system 500. The communication interface 504 may include a data receive function 504-1 and a data transmit function 504-2 that are configurable to communicate across a network, such as across an intranet or across the Internet. In some embodiments, the one more communication buses 508 include circuitry (sometimes called a chipset) that interconnects and controls communications between system components. In some embodiments memory 510 includes high speed random access memory (RAM) and also includes non-volatile memory such as one or more magnetic or optical disk-storage devices or solid state storage devices such as Flash memory or magnetic random access memory (MRAM). Memory 510 optionally includes one or more storage devices remotely located from the CPU(s) 502.

In some embodiments, the system 500 includes a display 503 that is local to the system 500, while in other embodiments the system includes, utilizes or sends information to a display 503 that is located remotely from the system 500. For example the display 503 may be part of a workstation or other computer located across a network. Alternately, the display 503 may be a network connected device to which system 500 sends information.

Memory 510, or alternately the non-volatile memory device(s) within memory 510, comprises a computer readable storage medium. In some embodiments, memory 510 stores the following programs, modules and data structures, or a subset or superset thereof:

an operating system 512 that includes procedures for handling various basic system services and for performing hardware-dependent tasks;

a network communications module (or instructions) 514 that is used for connecting system 500 to other computers via communication interface 504 (wired or wireless) and one or more communications networks, such as the Internet, other wide area networks, metropolitan area networks, and local area networks. The network communications module 514 includes receiving and transmittal instructions 516 for implementing the above connections; and an application or program 520 for controlling the operation and function of the system 500.

In some embodiments, application 520 includes the following programs, modules, or a subset or superset thereof:

module or instructions 522 for data retrieval, including accessing a first (new) netlist and second trusted netlist; in an embodiment, the new and trusted netlists are stored locally, or remotely, or a combination thereof, and the data retrieval is from memory, from storage, or from other servers or computers.

static analysis module or instructions 524 for performing static analysis on the new netlist and identifying a synthesizable section and non-synthesizable section of the new netlist; module or instructions 524 optionally include a Lint program 526.

logic equivalence module or instructions 528 for determining logic equivalence between the synthesizable section of the new netlist and a corresponding synthesizable section of the trusted netlist. Logic equivalence module or instructions 528 optionally includes a digital logic equivalence check program 530 for performing digital logic equivalence checking. Examples of commercially available equivalence checking tools include Prover eCheck and Cadence Conformal.

functional equivalence module or instructions 532 for determining functional equivalence between the non-synthesizable section of the new netlist and a corresponding non-synthesizable section of a trusted netlist. Module or instructions 532 include a module or instructions 534 for performing a transistor-level simulation (for example, a Spice simulator or Verilog-AMS simulator) or a behavioral simulation (e.g., Verilog simulation). In some embodiments, module or instructions 532 further includes at least one of: a module or instructions 536 for performing a difference determination (for example, a "diff" program or related text utility), and a module or instructions 538 for performing a characteristic check for checking a characteristic of a file such as a date stamp, operator, etc. as described earlier regarding testing procedure 342.

output module or instructions 540 for providing an equivalence result, based on the determined functional equivalence and the determined logical equivalence, for rendering on the display 503. The output module 540 optionally includes a program 542 to determine if the first (new) netlist is a trusted netlist.

in some embodiments, application 520 includes other functions 546.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 510 may store a subset of the modules and data structures identified above. Furthermore, memory 510 may store additional modules and data structures not described above.

Although FIG. 5 shows a system 500, FIG. 5 is intended more as functional description of the various features which may be present in a workstation, a set of workstations, or a set of servers, than as a structural schematic of the embodiments described herein. In practice, and as recognized by those of ordinary skill in the art, items shown separately could be combined and some items could be separated. For example, some items shown separately in FIG. 5 could be implemented on single servers or workstations and single items could be implemented by one or more servers or workstations. The actual number of servers or workstations used to implement system 500 and how features are allocated among them will vary from one implementation to another, and may depend in part on the amount of data traffic that the system must handle during peak usage periods as well as during average usage periods.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A computer-implemented method of performing an equivalence check on a mixed-signal circuit, comprising:
   at a computer system, having non-transitory computer readable memory storing one or more programs for execution, by the one or more processors of the computer system, to respond to a verification request by:
   performing a static analysis on a first netlist and identifying a synthesizable section and a non-synthesizable section of the first netlist;
   determining functional equivalence between the non-synthesizable section of the first netlist and a corresponding non-synthesizable section of a second netlist;
   determining logical equivalence between the synthesizable section of the first netlist and a corresponding synthesizable section of the second netlist; and
   providing an equivalence result based on the determined functional equivalence and the determined logical equivalence.

2. The method of claim 1, wherein the operation of determining functional equivalence comprises checking if the non-synthesizable portion of the first netlist has a different characteristic than the corresponding non-synthesizable portion of the second netlist.

3. The method of claim 2, wherein the characteristic is one selected from a time stamp, a version control number, a file name, an operator, a permission level, a location, or information in the netlist.

4. The method of claim 1, wherein determining functional equivalence comprises performing a text difference detecting operation between the first netlist and second netlist.

5. The method of claim 1, wherein the operation of determining functional equivalence comprises performing a simulation on the non-synthesizable sections of the first netlist and the second netlist and comparing the results.

6. The method of claim 5, wherein performing a transistor-level simulation comprises simulating with a tool supporting at least one of Spice and Verilog-AMS.

7. The method of claim 1, wherein the operation of determining logical equivalence comprises performing a digital logical equivalence check.

8. The method of claim 1, wherein performing a static analysis comprises accessing a Lint program.

9. The method of claim 1, wherein the second netlist is a trusted netlist.

10. The method of claim 9, wherein the operation of providing an equivalence result comprises providing a result that the first netlist is a trusted netlist.

11. The method of claim 10 further comprising accessing a static analysis result for the second netlist.

12. The method of claim 11, wherein the static analysis result for the second netlist was generated prior to receiving the verification request.

13. A computer-implemented system for performing an equivalence check on a mixed-signal circuit, comprising:
   one or more processors; and
   memory storing one or more programs, the one or more programs including:
      data retrieval instructions to retrieve a first netlist and a second netlist;
      static analysis instructions for receiving the first netlist and identifying a synthesizable section and non-synthesizable section of the first netlist;
      functional equivalence instructions for receiving at least a portion of the first netlist and at least a portion of the second netlist and determining functional equivalence between the non-synthesizable section of the first netlist and a corresponding non-synthesizable section of the second netlist;
      logical equivalence instructions for receiving at least a portion of the first netlist and at least a portion of the second netlist and determining logical equivalence between the synthesizable section of the first netlist and a corresponding synthesizable section of the second netlist; and
      output instructions providing an equivalence result based on the determined functional equivalence and the determined logical equivalence.

14. The system of claim 13, wherein the static analysis instructions include a Lint program.

15. The system of claim 13, wherein the functional equivalence instructions comprise text difference determining instructions.

16. The system of claim 15, wherein the functional equivalence instructions comprise transistor-level simulation instructions.

17. The system of claim 13, wherein the functional equivalence instructions comprise characteristic-checking instructions.

18. The system of claim 17, wherein the characteristic-checking instructions include instructions to check for one selected from a time stamp, a version control number, a file name, an operator, a permission level, a location, or information in the netlist.

19. The system of claim 13, wherein the logical equivalence instructions comprise digital logic equivalence check instructions.

20. The system of claim 13, wherein the second netlist is a trusted netlist.

21. The system of claim 20, wherein the static analysis instructions comprise instructions to access a static analysis result for the second netlist.

22. The system of claim 21, wherein the static analysis result was generated prior to receiving the verification request.

23. The system of claim 20, wherein the output instructions comprise instructions to receive an input from the functional equivalence module and an input from the logical equivalence module, for determining if the first netlist is a trusted netlist.

24. A non-transitory computer-readable storage medium, the medium storing instructions that when executed by a computer system will cause the computer system to:
   in response to a command from a client to perform a verification operation,
      perform a static analysis on a first netlist and identify a synthesizable section and non-synthesizable section of the first netlist;
      determine a functional equivalence between the non-synthesizable section of the first netlist and a corresponding non-synthesizable section of a second netlist;
      determine a logical equivalence between the synthesizable section of the first netlist and a corresponding synthesizable section of the second netlist; and
      provide an equivalence result, based on the determined functional equivalence and the determined logical equivalence.

25. The non-transitory computer-readable storage medium of claim 24, wherein the instructions to perform the static analysis comprise instructions for a Lint program.

26. The non-transitory computer-readable storage medium of claim 24, wherein the instructions to determine functional equivalence comprise text difference determining instructions.

27. The non-transitory computer-readable storage medium of claim 26, wherein the instructions to determine functional equivalence comprise transistor-level simulation instructions.

28. The non-transitory computer-readable storage medium of claim 24, wherein the instructions to determine functional equivalence comprise characteristic-checking instructions.

29. The non-transitory computer-readable storage medium of claim 28, wherein the characteristic-checking instructions include instructions to check for at least one characteristic selected from a time stamp, a version control number, a file name, an operator, a permission level, a location, or information in the netlist.

30. The non-transitory computer-readable storage medium of claim 24, wherein the instructions to determine logical equivalence comprise digital logic equivalence check instructions.

31. The non-transitory computer-readable storage medium of claim 24, wherein the second netlist is a trusted netlist.

32. The non-transitory computer-readable storage medium of claim 31, wherein the static analysis instructions, when executed by the computer system, cause the computer system to access a static analysis result for the second netlist.

33. The non-transitory computer-readable storage medium of claim 32, wherein the static analysis result was generated prior to receiving the verification request.

34. The non-transitory computer-readable storage medium of claim 31, wherein the instructions to provide the equivalence result comprise instructions for receiving an input from the functional equivalence determination and an input from the logical equivalence determination, for determining if the first netlist is a trusted netlist.

35. A computer system, comprising:
   a display;
   one or more processors; and
   memory storing a verification application for rendering on the display a portion of a verification operation, the verification application including instructions that when executed by the one or more processors cause the computer system to:
      access a first netlist;
      access a second netlist;
      perform a static analysis on the first netlist and identify a synthesizable section and non-synthesizable section of the first netlist;
      determine a functional equivalence between the non-synthesizable section of the first netlist and a corresponding non-synthesizable section of the second netlist;
      determine a logical equivalence between the synthesizable section of the first netlist and a corresponding synthesizable section of the second netlist; and
      provide an equivalence result, based on the determined functional equivalence and the determined logical equivalence, for rendering on the display.

36. A non-transitory computer-readable storage medium, the medium storing instructions which when executed on a processor will cause the processor to:
   perform a static analysis on a first netlist and identify a synthesizable section and non-synthesizable section of the first netlist;
   determine a functional equivalence between the non-synthesizable section of the first netlist and a corresponding non-synthesizable section of a second netlist;
   determine a logical equivalence between the synthesizable section of the first netlist and a corresponding synthesizable section of the second netlist; and
   provide an equivalence result, based on the determined functional equivalence and the determined logical equivalence, for rendering on a display.

* * * * *